United States Patent
Voris et al.

(10) Patent No.: US 9,568,526 B2
(45) Date of Patent: Feb. 14, 2017

(54) NOISE DETECTION AND CORRECTION ROUTINES

(71) Applicant: Microchip Technology Incorporated, Chandler, AZ (US)

(72) Inventors: Andrew Voris, Brown Deer, WI (US); Burke Davison, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 666 days.

(21) Appl. No.: 14/025,143

(22) Filed: Sep. 12, 2013

(65) Prior Publication Data
US 2014/0074436 A1 Mar. 13, 2014

Related U.S. Application Data

(60) Provisional application No. 61/700,399, filed on Sep. 13, 2012.

(51) Int. Cl.
*G01R 27/26* (2006.01)
*G06F 3/044* (2006.01)
*H03K 17/955* (2006.01)

(52) U.S. Cl.
CPC .......... *G01R 27/2605* (2013.01); *G06F 3/044* (2013.01); *H03K 17/955* (2013.01)

(58) Field of Classification Search
CPC ... G01R 27/2605; G01R 29/26; G06F 3/0418; H03K 17/955; G02F 1/13338; G01D 3/036; G01D 5/24; G01D 5/2405
See application file for complete search history.

(56) References Cited

U.S. PATENT DOCUMENTS

| | | | |
|---|---|---|---|
| 5,789,689 A | 8/1998 | Doidic et al. | 84/603 |
| 2008/0143671 A1 | 6/2008 | Li | 345/156 |
| 2011/0115729 A1* | 5/2011 | Kremin | G06F 3/0418 |
| | | | 345/173 |
| 2012/0049869 A1 | 3/2012 | Kremin et al. | 324/679 |
| 2013/0268229 A1* | 10/2013 | Gleeson, III | G01R 31/2849 |
| | | | 702/108 |

OTHER PUBLICATIONS

International Search Report and Written Opinion, Application No. PCT/US2013/059630, 15 pages, Dec. 19, 2013.

* cited by examiner

*Primary Examiner* — Manuel L Barbee
(74) *Attorney, Agent, or Firm* — Slayden Grubert Beard PLLC

(57) ABSTRACT

A system for reducing noise in a sensor measurement system includes a noise detector for detecting noise in capacitive to digital conversion measurements; a noise correction module operably coupled to the noise detector and configured to dynamically modify one or more delays associated with a sampling waveform; and a noise filter for filtering the sampling waveform.

20 Claims, 15 Drawing Sheets

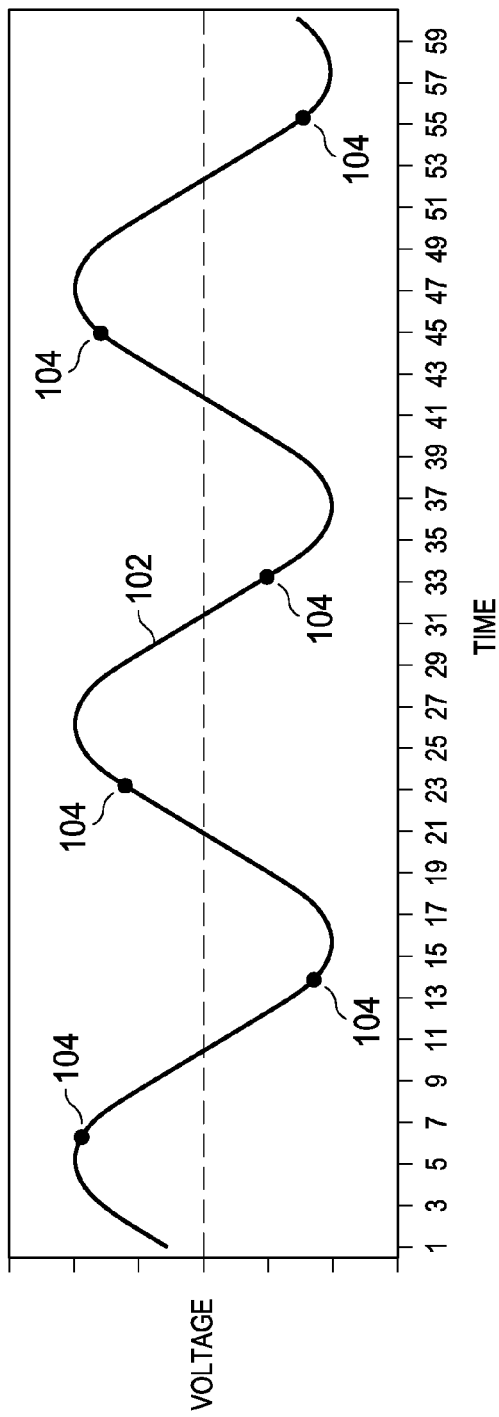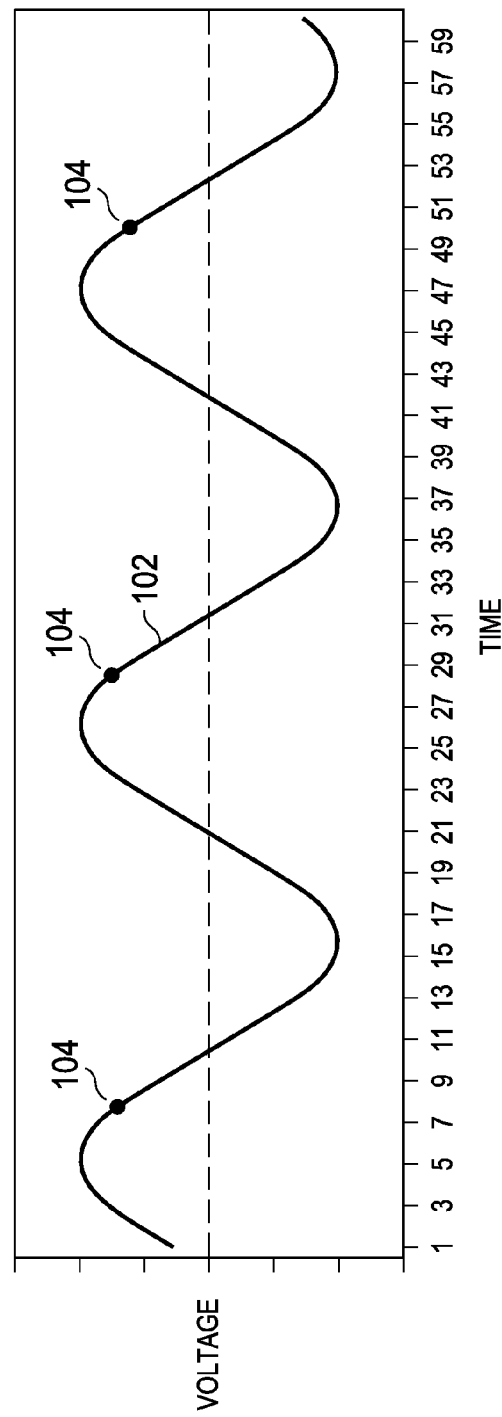

NOISE DETECTION AND CORRECTION ROUTINES

CROSS REFERENCE TO RELATED APPLICATIONS

This application claims the benefit of U.S. Provisional Application No. 61/700,399, filed Sep. 13, 2012, which is hereby incorporated in its entirety as if fully set forth herein.

TECHNICAL FIELD

The present disclosure relates to active noise rejection, in particular, to sampling optimization for active noise rejection for touch sensor and touchscreen systems.

BACKGROUND

Capacitive touch sensors are used as user interfaces to electronic equipment, e.g., computers, mobile phones, personal portable media players, calculators, telephones, cash registers, gasoline pumps, etc. In some applications, opaque touch sensors provide soft key functionality. In other applications, transparent touch sensors overlay a display to allow the user to interact, via touch, with objects on the display. Such objects may be in the form of soft keys, menus, and other objects on the display. The capacitive touch sensors or touch screens are activated (controls a signal indicating activation) by a change in capacitance of the capacitive touch sensor when an object, e.g., a user's fingertip, causes the capacitance thereof to change.

Such touchscreens and touch sensors are highly affected by their environment. Consequently, an important characteristic of a capacitive touch solution is its ability to reject noise. Other sensor applications may suffer under similar restrictions.

In particular, capacitive sensor applications are tested under IEC (International Electrotechnical Commission) Standard 61000-4-6 for conducted noise immunity. This type of noise appears on the sensors' signals as random variations off an average and gets worse when the user's body is near the sensor.

With noise present on the signal, the sensor must be sampled multiple times to verify the result was not an accident due to random variation. As the amount of noise increases, the amount of additional samples must also increase. This slows the overall response time of the system, resulting in an undesirable user experience. Scanning at one, fixed sampling rate will cause the system to perform well at some noise frequencies, while other frequencies may cause the signal to degrade to the point of inoperability.

SUMMARY

A method for reducing noise in a sensor measurement system in accordance with embodiments includes performing capacitive to digital conversion measurements; detecting that the sensor measurement system is experiencing noise; and dynamically modifying one or more delays associated with a sampling waveform. In some embodiments, the one or more delays comprise one or more delays in a time between samples of the sampling waveform. In some embodiments, the one or more delays comprise one or more delays in a time between an end of a one sampling waveform and the start of a next sampling waveform. In some embodiments, the one or more delays comprise one or more delays in an acquisition time of a sample. In some embodiments, detecting that the sensor measuring system is experiencing noise comprises performing noise scans and determining a summed mean difference between sets of measurements. In some embodiments, detecting that the sensor measuring system is experiencing noise comprises performing noise scans and determining if a measurement is asymmetrical. In some embodiments, the method further includes filtering the sampling waveform.

A system for reducing noise in a sensor measurement system in accordance with embodiments includes a noise detector for detecting noise in capacitive to digital conversion measurements; a noise correction module operably coupled to the noise detector and configured to dynamically modify one or more delays associated with a sampling waveform; and a noise filter for filtering the sampling waveform. In some embodiments, the one or more delays comprise one or more delays in a time between samples of the sampling waveform. In some embodiments the one or more delays comprise one or more delays in a time between an end of a one sampling waveform and the start of a next sampling waveform. In some embodiments the one or more delays comprise one or more delays in an acquisition time of a sample. In some embodiments the noise detector is configured to determine a summed mean difference between sets of measurements of a noise scan. In some embodiments the noise detector is configured to determine if a measurement of a noise scan is asymmetrical. In some embodiments, the system includes a digital filter for filtering the sampling waveform.

A computer program product according to embodiments includes one or more tangible computer-readable media including instructions which, when executed on a computer, implement a method for reducing noise in a sensor measurement system, including performing capacitive to digital conversion measurements, detecting that the sensor measurement system is experiencing noise, and dynamically modifying one or more delays associated with a sampling waveform. In some embodiments the one or more delays comprise one or more delays in a time between samples of the sampling waveform. In some embodiments the one or more delays comprise one or more delays in a time between an end of a one sampling waveform and the start of a next sampling waveform. In some embodiments the one or more delays comprise one or more delays in an acquisition time of a sample. In some embodiments detecting that the sensor measuring system is experiencing noise comprises performing noise scans and determining a summed mean difference between sets of measurements. In some embodiments detecting that the sensor measuring system is experiencing noise comprises performing noise scans and determining if a measurement is asymmetrical. In some embodiments the method further includes filtering the sampling waveform.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein:

FIG. 1 and FIG. 2 illustrate how noise frequency interacts with sampling frequency.

DETAILED DESCRIPTION

Figure 3:
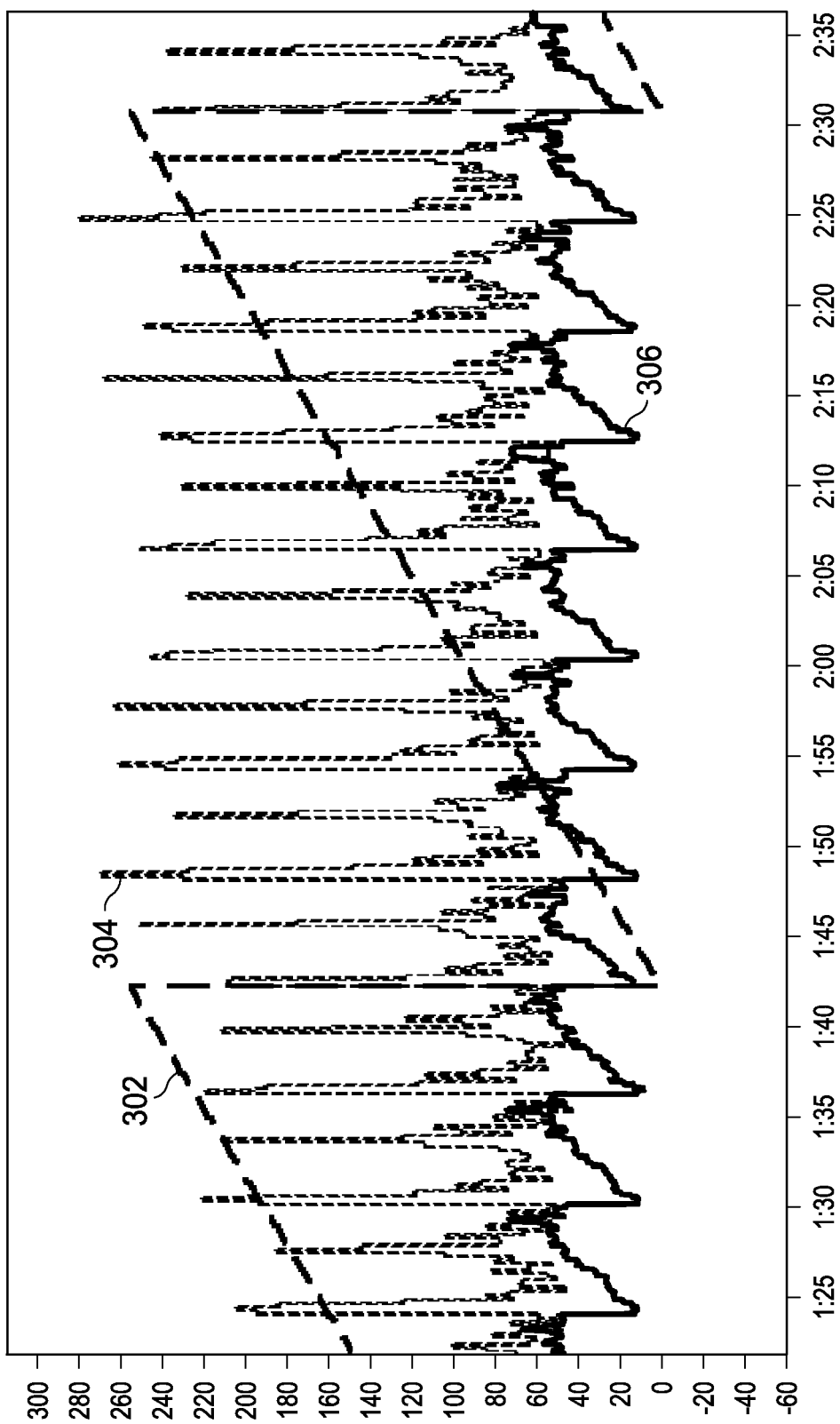
FIG. 3 is a diagram illustrating how changing sampling timing will change the noise level in accordance with embodiments.

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

The signal-to-noise ratio (SNR) of capacitive touch evaluation signals should be optimized for the specific noise profile of each device and its environment. Different types and frequencies of noise require adjustments to the waveform's sampling rate and filter coefficients for the highest noise rejection. A system according to various embodiments actively optimizes the SNR of the signal at runtime while maintaining the sensors' response time requirements.

FIG. 1 and FIG. 2 show a simplified example of how the noise frequency interacts with the sampling frequency. The waveform 102 represents noise that is being introduced into the system. Measurements will follow this noise signal. The dots 104 indicate the time when a sample is performed on the sensor. In FIG. 1, the noise causes the samples to vary in voltage significantly while in FIG. 2, the noise is synchronized with the sampling frequency to minimize the voltage difference from reading-to-reading. Taking the average of a set of samples will attenuate the noise in FIG. 1, but the offset from FIG. 2 may still be present in the final result. For this reason, we will refer to FIG. 1 as an example of nondestructive noise, and FIG. 2 as an example of destructive noise.

Sampling multiple times and taking the average can reduce the noise further, but sacrifices response time for signal quality. For this reason, only a limited number of additional samples can be taken. Another approach is to randomize the sampling rate, which will have the effect of averaging the noise across all frequencies. While this helps eliminate the worst case (too much noise to operate), it also eliminates the best case conditions (no noise at all) and requires a high amount of oversampling, increasing the overall response time.

According to various embodiments, real-time tuning of the sensor's waveform timing and digital filters can be used to actively attenuate the measured noise level.

While capacitive sensors have been on the market for years as input devices, current solutions do not offer such active noise tuning capability. Standard optimization techniques change only the coefficients in a static software algorithm. According to the present embodiments, however, the scanning technique is additionally modified by itself to minimize the noise at the acquisition stage rather than in a later digital signal processing stage.

According to various embodiments, first, a measurement is calculated to track the level of noise on the signal. When data memory is limited on the controller, a running average of the difference between the baseline (i.e., average) sensor value and its current reading may be used. When data memory is not limited, the interquartile range of an array of samples can provide a more stable measurement of noise and is preferred. Additional history tracking allows lower frequency noise detection. Other embodiments may employ differential measurement, in which the noise is measured by determining how non-symmetrical the measurement is.

Second, the time delays and oversampling counts used when generating the capacitive sensing signal are copied from the sensor's current settings to an optimization-engine's settings. Once copied, the optimization will edit one of the values and perform a series of scans. Which value is edited depends on the current state of the sensor. If the noise measurement is larger than a user-defined limit, the oversampling amount is increased quickly. If the noise measurement is smaller than half the same user-defined limit, the oversampling amount is decreased slowly.

If oversampling is not being adjusted, the timing parameters will each take turns being changed to a random value. Only one value is edited at any specific time. Once a parameter has been adjusted, a set of samples are taken with the new settings. In all cases, if a change in the timing or oversampling will cause a change in the gain of the signal, scaling is performed to equalize the gain across all possible values.

The timing settings that can be optimized are:

The time between sample A and sample B of one sampling waveform, if two samples are required.

The time between the end of a one waveform and the start of the next waveform.

The acquisition time of each sample (where the acquisition time is defined as the time when the sensor is actively being measured).

FIG. 3 shows an example of how changing the timing will change the noise level. In the graph of FIG. 3, noise is being injected on the sensor at 150 kHz. The line 302 represents the amount of time added between the two ADC samples of a single capacitive sensing waveform. It begins at 0, increases to 255, then repeats. The line 304 is the interquartile range of the last 16 samples. (A measurement of the noise of the signal.) The line 306 is the difference between maximum and minimum signal values over the very-recent history. (Typically, the eight previous samples.) The level of noise (both 304 and 306) will increase and decrease based on the timing.

Various embodiments search for the timing value 302 that produces the smallest noise values 304, 306 and replaces it with the current timing. The noise levels of the new settings are compared with the noise levels of the sensor's current scan settings. If the new settings provide a cleaner overall signal, they are copied over to become the values to be used for that sensor. If the new settings do not provide a cleaner signal, no changes occur. The process will then repeat, resulting in a system that actively tunes for the quietest possible sample timing while maintaining a high signal-to-noise ratio in the short-term (while the tuning is taking effect) by using oversampling.

Attention is now directed to a system that may be used in implementing noise detection and correction in accordance with embodiments.

Figure 4:
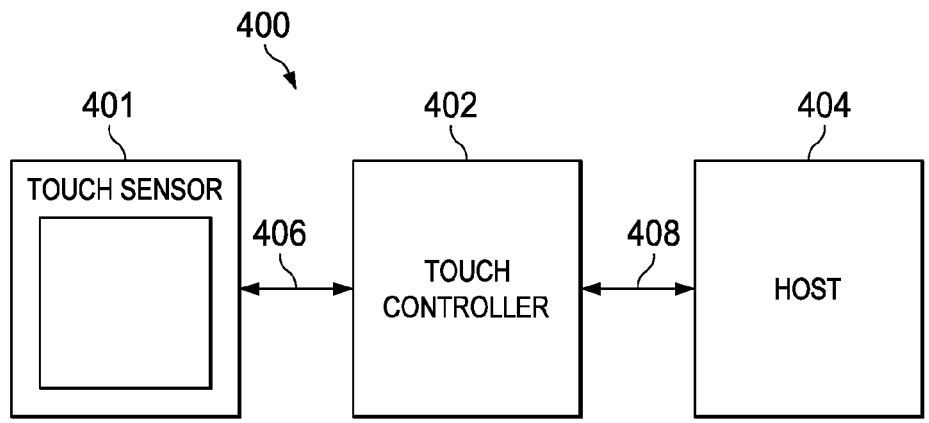
FIG. 4 is a diagram of a touch sensor system in accordance with embodiments.

FIG. 4 illustrates a block diagram of an example touch sensor system 400 in accordance with the present disclosure. As depicted in FIG. 1, system 400 may include touch sensor 401, touch controller 402, and host 404.

Touch sensor 401 may generally be operable to receive input via contact with a human finger or other hand held object (e.g., stylus, credit card, etc.). In general, touch sensor 401 is configured to recognize a touch event through a change in capacitance that results from the touch event. Touch sensor 401 may include one or more conductive elements that present a natural capacitance to a ground (or virtual ground) plane within touch sensor 401. Touch sensor 401 may be of a semi-transparent construction, allowing it to be placed in front of or integrated into a graphic (video) display system as a touch screen. Alternatively, touch sensor 401 may be of an opaque construction (e.g., touch pad used in many current laptop computers).

Touch controller 402 may generally be an electronic system operable to detect, measure, and report touch events on touch sensor 401. Touch controller 402 may be implemented as discrete electrical components, as a part of an integrated circuit, or some combination of both. As will be discussed in greater detail below, touch controller 402 may implement a sampling optimization algorithm for active noise rejection.

Host 404 may generally be a system that receives touch reports from touch controller 402. Host 404 may be configured to initiate some action based on such touch reports. In one embodiment, host 404 may correspond to a computer such as a server, desktop, laptop, or tablet computer. According to another embodiment, host 404 may correspond to, any of a variety of electronic devices including, for example, a mobile phone or a digital media (e.g., music, video, etc.) player.

As illustrated in FIG. 4, touch sensor 401, touch controller 402, and host 404 may be communicatively coupled via connections 406 and 408 to form system 400. Connections 406 and 408 may be any type of structure suitable for facilitating the communication of electronic signals, data, and/or messages (generally referred to as data). In addition, touch sensor 401, touch controller 402, and host 404 may communicate via connections 406 and 408 using any suitable signal(s) or communication protocol(s). In one embodiment, communication over connections 406 and 408 may be in the form of a custom communication protocol. According to another embodiment, communication over connections 406 and 408 may be according to any of a variety of known protocols/bus architectures. For example, such protocols/architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, Universal Serial Bus (USB), Video Electronics Standards Association (VESA) local bus, Internet protocol (IP), other packet-based protocol, small computer system interface (SCSI), Internet SCSI (iSCSI), Serial Attached SCSI (SAS) or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof.

While touch sensor 401, touch controller 402, and host 404 are depicted as separate blocks in FIG. 4, any physical configuration may be provided. For example, in one embodiment touch controller 402 and host 404 may be implemented as a single integrated circuit. In another embodiment, touch controller 402 and touch sensor 401 may be implemented as a standalone device separate from host 404. In yet another embodiment, touch sensor 401, touch controller 402, and host 404 may be implemented as one physical device with connections 406 and 408 as internal connections within the device. For embodiments including more than one physical device corresponding to touch sensor 401, touch controller 402, and host 404, the physical devices may be physically located at the same location or at remote locations. For example, connection 408 may be the Internet and host 404 may be a server computer located many miles away from touch sensor 401 and touch controller 402.

In operation, touch controller 402 may use circuitry to continually measure, via connection 406, the capacitance value of one or more conductive elements within touch sensor 401. When a user touches touch sensor 401 with a finger or other object, the touch changes the capacitance value at conductive element(s) near the touch location. Touch controller 402 may recognize the changed capacitance and determine that the touch sensor 401 has been touched. In embodiments where touch sensor 401 has more than one conductive element, touch controller 402 may determine the location of the touch or the specific conductive element that was touched. Touch controller 402 may then report the touch touched location to host 404. Host 404 may initiate some action based in whole or in part on the location of the touch.

Figure 5:
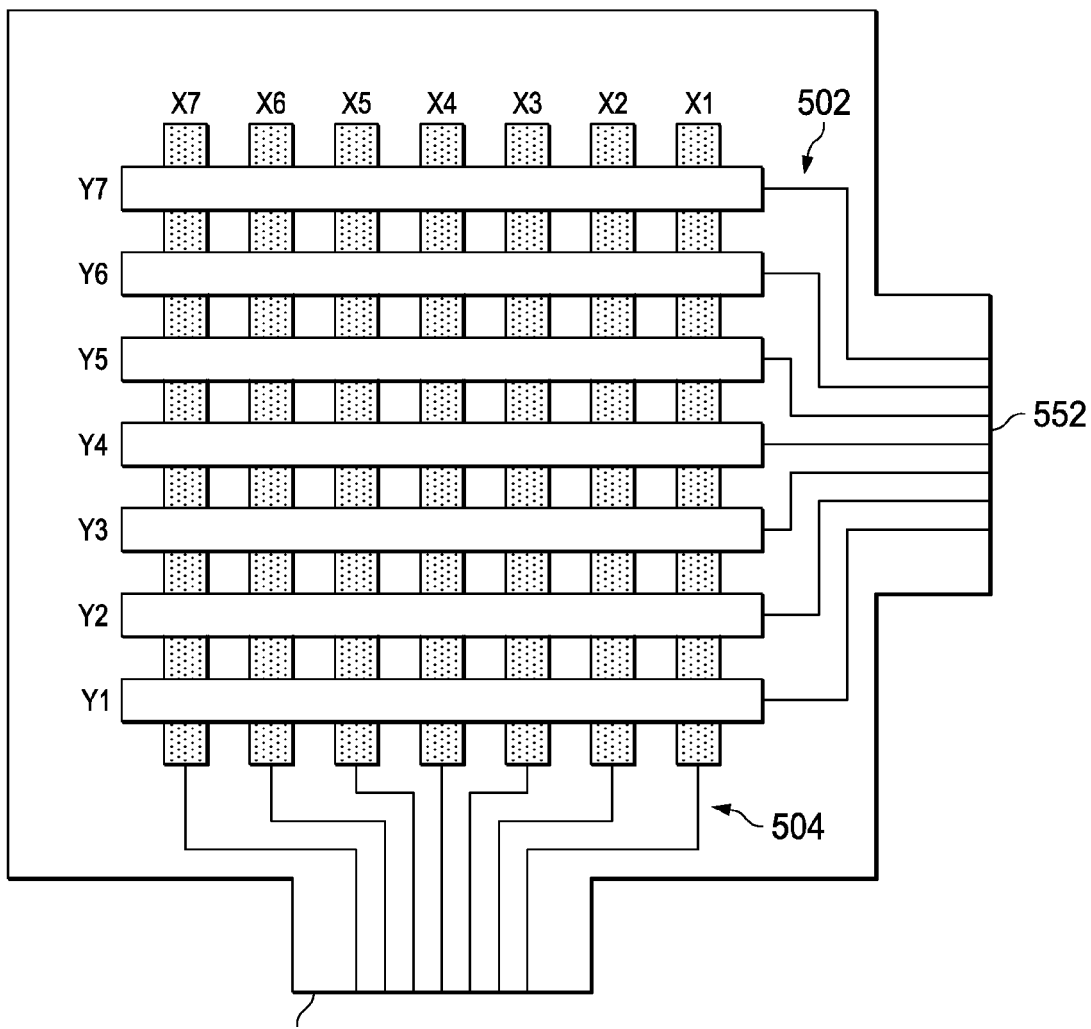
FIG. 5 is a top view of a touch sensor for a touch sensor system.

FIG. 5 illustrates a top view of an example touch sensor 401 in a touch sensor system 400, in accordance with the present disclosure. According to the depicted embodiment, touch sensor 401 may include dielectrically separated conductive elements X1-X7 and Y1-Y7 arranged in a grid pattern and forming a Cartesian coordinate system (x and y) in which each conductive element represents a different x or y coordinate. According to another embodiment, touch sensor 401 may include conductive elements arranged according to a polar coordinate system or some other coordinate system. In an embodiment having only one conductive element (e.g., a soft button), no coordinate system is required. The intersection of any single row electrode with any single column electrode is referred to as a node.

Each of conductive elements X1-X7 and Y1-Y7 may be electrically connected via traces 502 and 504 to ports 552 and 554. In the embodiment shown, each conductive element is separately and directly connected to a respective one of ports 552 and 554. According to another embodiment, traces 502 and 504 may be connected directly or indirectly (e.g., with intervening logic) to more than one of conductive elements X1-X7 and Y1-Y7.

Conductive elements X1-X7 and Y1-Y7 may be formed with any suitable conductive medium. In a semi-transparent touch sensor configuration, capacitive elements X1-X7 and Y1-Y7 may be formed with, for example, indium tin oxide (ITO). In an opaque touch sensor configuration, capacitive elements X1-X7 and Y1-Y7 may be formed with, for example, copper.

Ports 552 and 554 may provide an interface to the touch controller 402 in which the waveform 102 of FIG. 1 may be coupled. While the disclosed embodiment includes one port 552 corresponding to conductive elements Y1-Y7 and a separate port 554 corresponding to conductive elements X1-X7, other embodiments may comprise a single port or more than two ports. In these cases, traces 502 and 504 are routed to the desired port(s).

Figure 6:
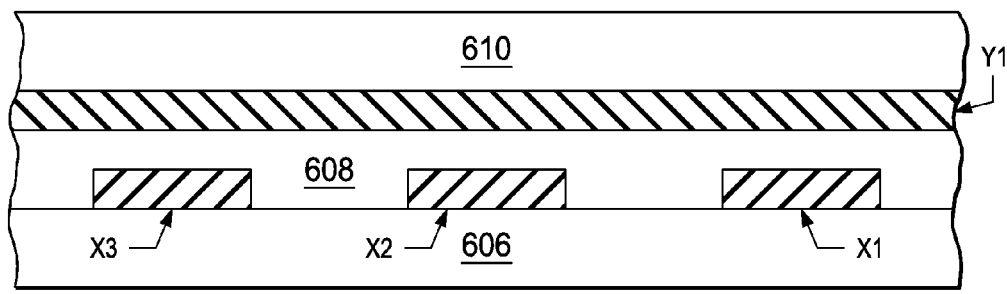
FIG. 6 is a side elevation of a touch sensor for a touch sensor system in accordance with embodiments.

FIG. 6 illustrates a partial cross-section, front elevation view of an example touch sensor 401 in a touch sensor system 400. As depicted, touch sensor 401 may comprise substrate layer 606 onto which conductive elements X1-X3 are formed. Insulating layer 608 may dielectrically separate conductive elements X1-X3 from conductive element Y1. Surface layer 610 may be formed on top of conductive element Y1 and provide the input surface of touch screen 401 (i.e., the surface that the user touches with a finger or other object). In a semi-transparent touch sensor configuration, substrate 606 and surface layer 610 may be formed with, for example, glass or clear plastic (e.g., Plexiglas); and insulating layer 608 may be formed with, for example, a clear adhesive or other semi-transparent materials having good insulating characteristics. In an opaque touch sensor configuration, substrate 606 may be formed with, for example, a fiberglass (FR-4) printed circuit board (PCB) material; insulating layer may be formed with, for example, any suitable adhesive or other material having good insulating characteristics; and surface layer 610 may be formed with, for example, glass or plastic. It is noted that, in other embodiments, the insulating layer 608 may not be present and the X and Y conductive elements form a single layer. Thus, the figure is exemplary only.

Figure 7:
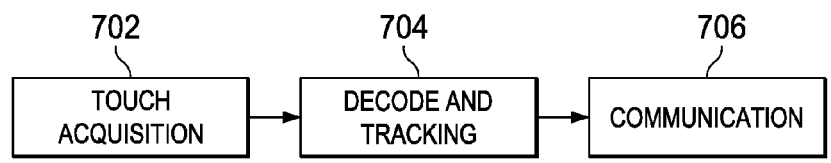
FIG. 7 is a block diagram of an implementation of a touch controller in accordance with embodiments.

As will be discussed in greater detail below, the touch controller 402 implements one or more routines, such as firmware routines, for noise optimization. As shown in FIG. 7, the touch controller may include touch acquisition 702, decode and tracking 704, and communication 706 routines. Touch acquisition 702 includes scanning for touch presence and updating baseline sampling. Decode and tracking 704 takes the acquired data and determines if a touch is present, as well as resolving its coordinates and tracking previous touches. Communication routine 706 includes reporting the generated touch data to the host system 404.

As will be discussed in greater detail below, noise optimization in accordance with embodiments includes filtering and noise detection which can be run in the Touch Acquisition phase 702. In some embodiments, it is closer to a point in between Touch Acquisition 702 and Decode and Tracking 704 (since a touch needs to be detected before running the routines).

Figure 8:
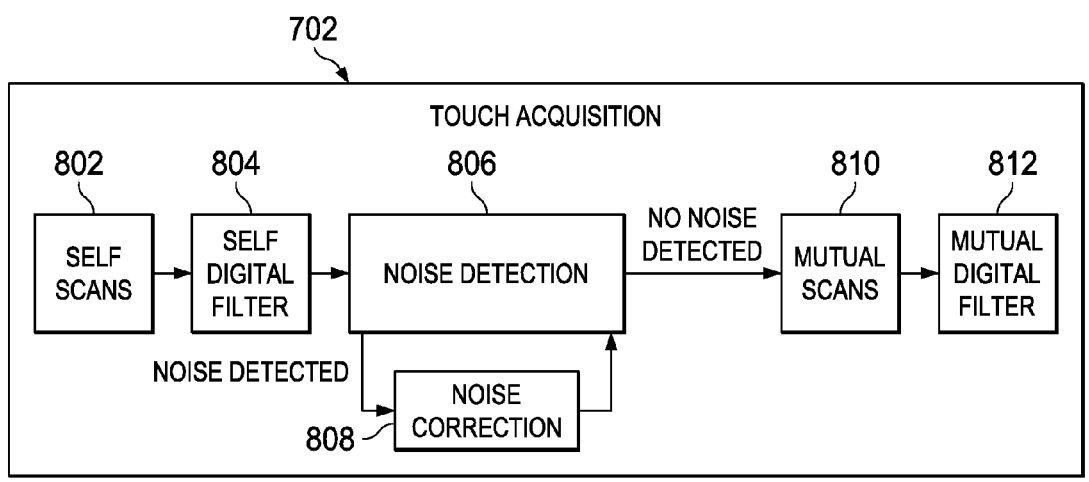
FIG. 8 is a diagram illustrating touch acquisition with noise compensation in accordance with embodiments.

FIG. 8 is a lower-level view of an exemplary Touch Acquisition phase 702 showing how the noise routines and filtering interact with the normal flow of the firmware. As shown, touch acquisition 702 includes self scans 802, self digital filters 804, noise detection 806, noise correction 808, mutual scans 810 and mutual digital filtering 812.

Self scans 802 refer to measurements of self capacitance, i.e., the capacitive load, relative to circuit ground, that an electrode presents to the system. Mutual capacitance is the capacitive coupling between objects. One example is the mutual capacitive coupling between an X and Y axis electrode on a projected capacitive touch sensor. Thus, mutual scans 810 take mutual capacitance measurements at selected nodes.

The noise routines 806, 808 are run after self-measurements but before mutual measurements because it is only necessary to know that the channel is activated, not the individual node, to scan for noise. This is because noise is coupled into not the just node being touched, but the entire sense channel that node is located on. This means that it doesn't matter which node is chosen for a noise scan as long as it is located on the sense channel that is activated.

It is noted that, in some embodiments, the system may implement self-scanning and filtering without mutual scanning and filtering. Likewise, embodiments may employ mutual scanning but not self scanning In this case, the mutual scanning and filtering would occur prior to the noise routines.

The noise optimization can be separated into different parts based on their functions: 1.) Noise Detection; 2.) Noise Correction; 3.) Digital Filtering.

Noise Detection

Experiments have shown that even though a large amount of noise (>1 V) is introduced into the system at several frequencies, only a small fraction of those frequencies actually cause the Equipment Under Test (EUT) to fail in terms of performance. Thus, it is not necessary to correct all the noise, just the noise that causes the system to fail. By extension, only noise needs to be detected that causes the system to fail as well. Hence in the following, noise that causes the system to fail will be referred to as "destructive noise" while noise that does not will be referred to as "nondestructive noise."

The reason only some noise frequencies are harmful relates to the fundamental frequency of the noise and the frequency in which the sensor is scanned. FIG. 1 shows a simplified example of this. The line 102 is the noise that is being introduced into the system. All of our measurements will "ride" on this noise: rising when it does and falling when it does. The dots 104 indicate the time when a scan is performed on the sensor. Notice that the dots 104 are at about the same level along the y-axis. This means that an average of a predetermined number of samples (referred to as a "packet") will yield similar results, just like if the system wasn't experiencing any noise. This is basically what happens with nondestructive noise.

In contrast, as shown in FIG. 2, it will be noticed that there are times when the average of the sensor scans 104 will produce an offset. With this frequency of noise, an error will be introduced into the scan results. This is what happens when the system experiences destructive noise.

To put this in perspective, assuming that the peak-to-peak amplitude of the noise 102 is 1 V. A touch causes a change of about 20 mV from a no-touch state. That means that the system is attempting to detect a voltage change that is 1/50th of the amplitude of the noise that the signal is bouncing around on.

Separating destructive noise from nondestructive noise is the main goal of the noise detection aspect of the noise routines. This is difficult for a variety of reasons. The largest obstacle is the fact that the amount of noise coupled into the system is greatly influenced by touching the sensor. To further complicate matters, the noise coupled into the system isn't isolated to the individual node that is touched, but the entire sense channel. That is, the noise is coupled into every node on the electrode (channel), not just the one being touched. This plays an important part in when the noise detection routine is actually performed, which will be discussed below.

Figure 9:
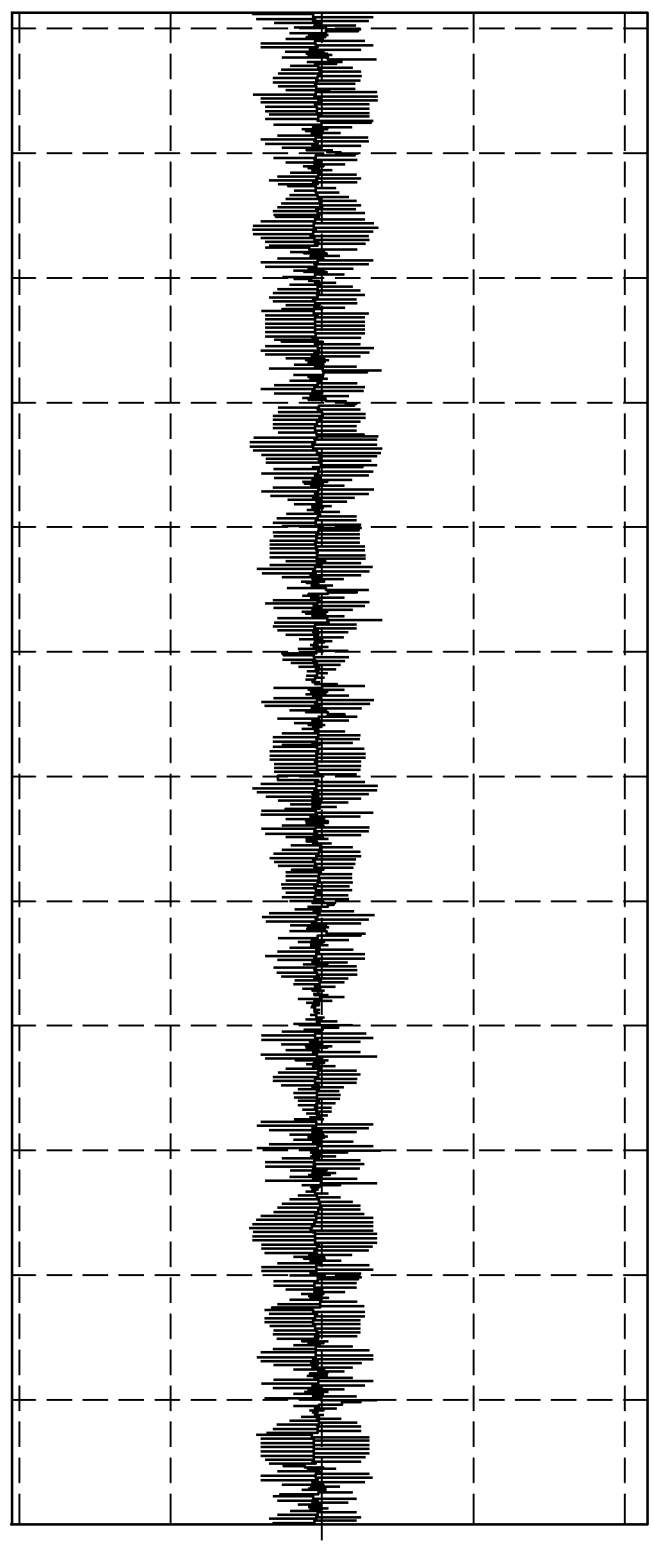
FIG. 9 illustrates noise during an exemplary no touch scenario.
Figure 10:
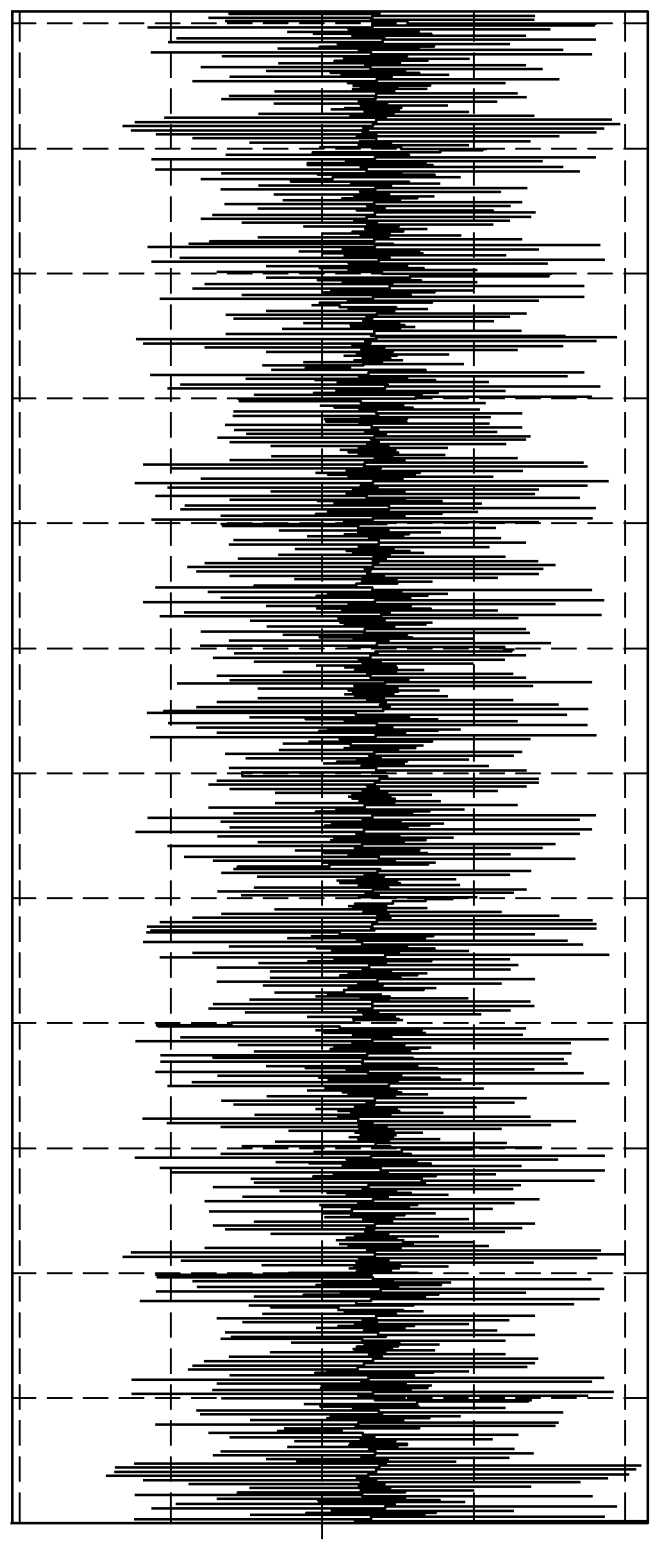
FIG. 10 illustrates noise during an exemplary touch scenario.

To illustrate, an example of a no-touch scenario and a touch scenario with the same amount of noise being applied to both is provided as shown in FIG. 9 and FIG. 10, respectively.

With this knowledge, embodiments are based around the fact that a touch needs to be detected first before destructive noise can be detected. The sensor will perform self measurements on each sensor channel as usual and only after it reports a touch on one of those channels will the noise detection routines begin. With a channel identified as a touch, the noise detection routines will then perform a user-defined number of mutual "noise scans" on one node in that activated channel. The noise scans are very similar to normal scans with the exception that no filtering is done on noise scans and the data returned by the scan is handled differently.

Like normal scans, noise scans are comprised of a set of capacitance measurements whose size is based on the current amount of oversampling. Instead of returning the sum of these measurements like a normal scan, however, the noise scan finds the mean capacitive measurement and returns that value. These mean values are compared to the mean value taken right before it and their difference is computed. All of these mean differences are summed together to compute a "summed mean difference" between each set of capacitive measurements. This summed mean difference will be used as the sole identifier for noise in the system. The algorithm can be expressed as the following:

Given a sample set of $n$ values $[Y_0 \ldots Y_n]$ SMD=$\Sigma_{x=1}^n \max(Y_x, Y_{x-1}) - \min(Y_x, Y_{x-1})$ As a quick and basic example, suppose five noise scans are taken after identifying a channel as a touch. The mean values for each scan is computed and stored, which turns out to be the following set:

{75,78,74,72,75}

The following computation would be done to find the summed mean difference:

(78−75)+(78−74)+(74−72)+(75−72)=12

Figure 11:
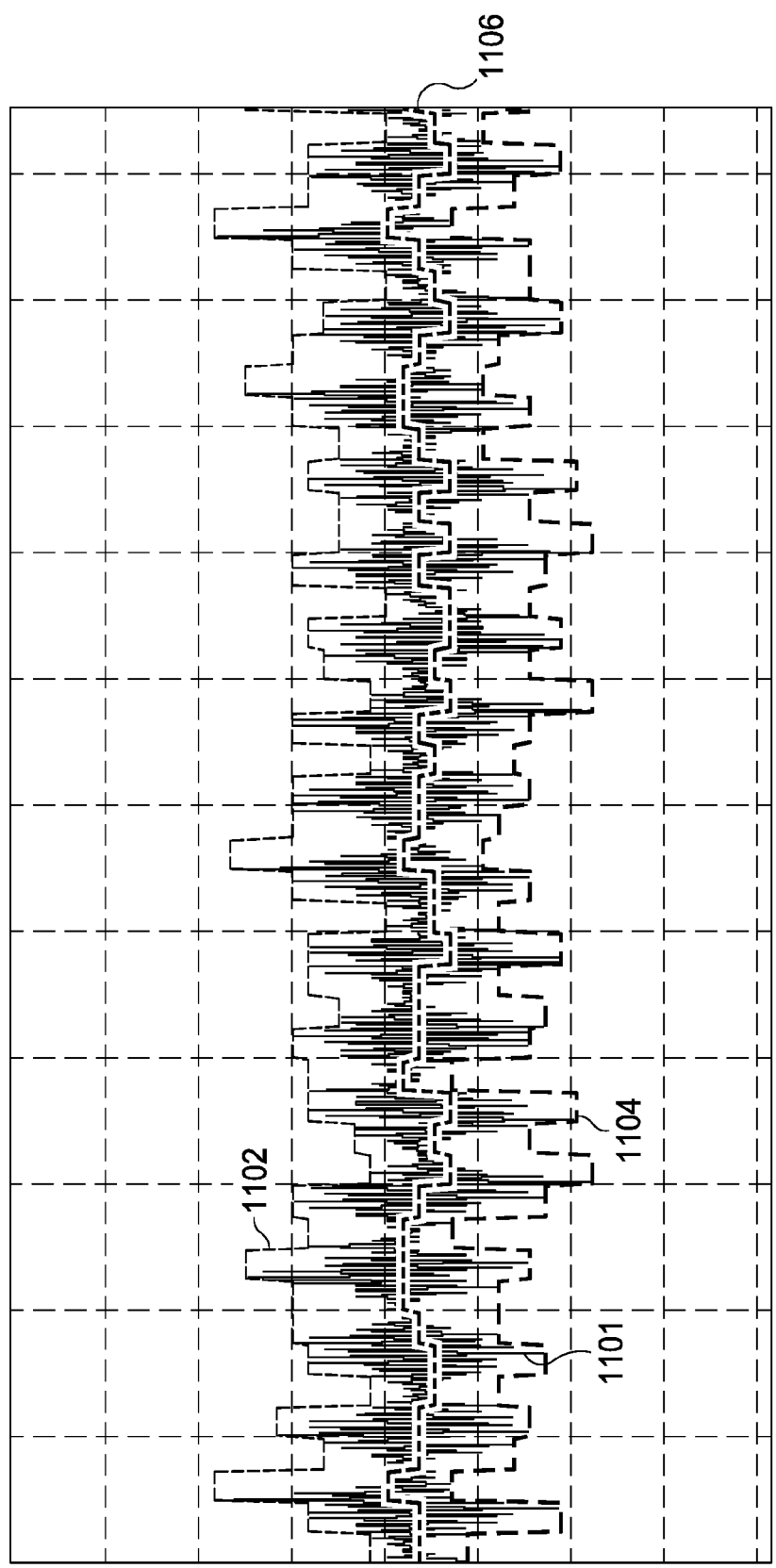
FIG. 11 illustrates nondestructive noise.
Figure 12:
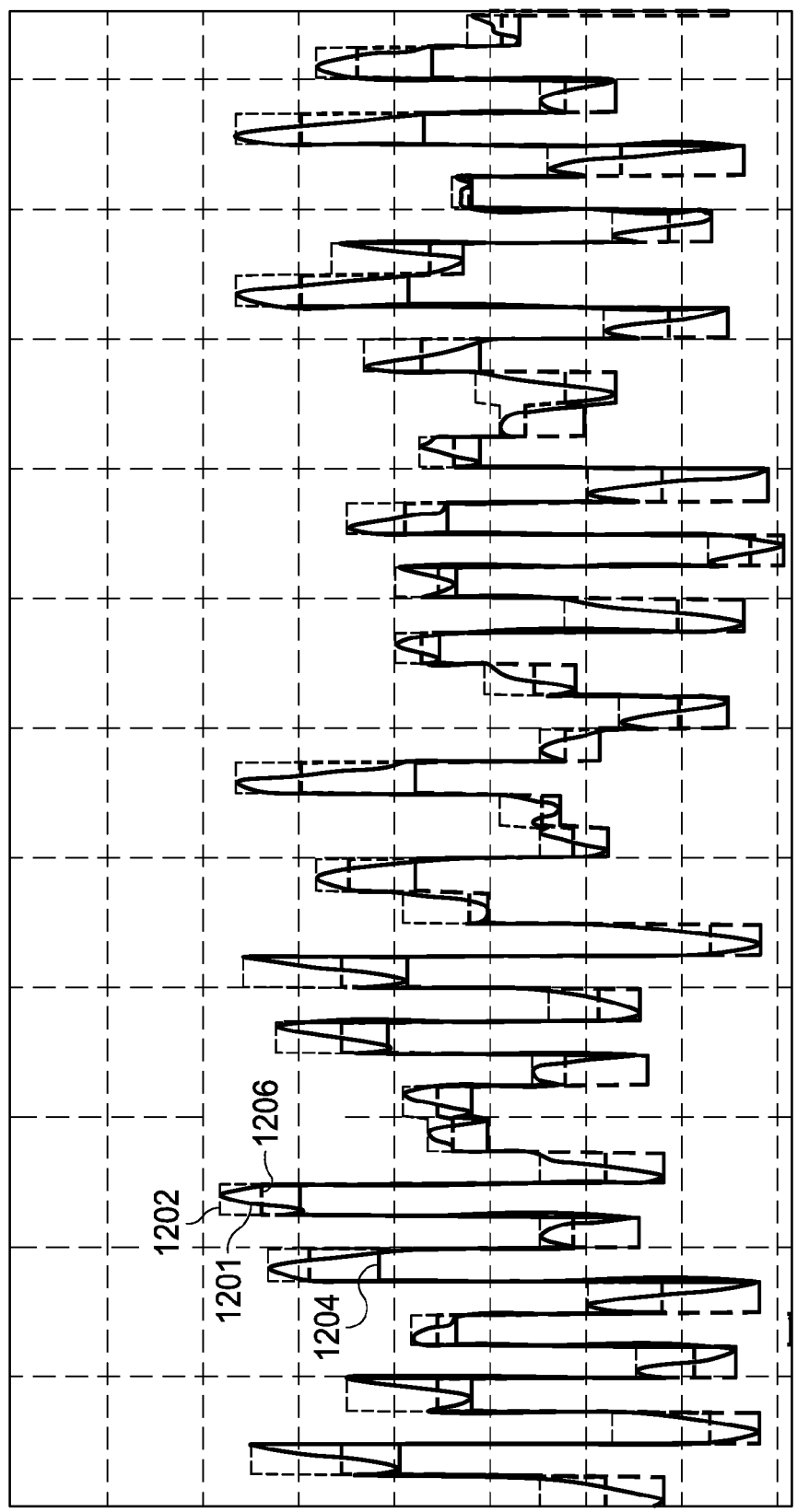
FIG. 12 illustrates destructive noise.

The reason for doing so is shown by way of example in FIG. 11 and FIG. 12. In particular, FIG. 11 shows nondestructive noise 1101. While there is definitely noise on the system, it is orthogonal around a horizontal axis. The line 1102 represents the maximum value and the line 1104 represents the minimum values for noise at given times. The line 1106 represents the mean of the set and doesn't vary much from sample set to sample set. This type of noise will return a low value for the summed mean difference.

Destructive noise 1201 is shown in FIG. 12. The signal is no longer symmetrical around the horizontal axis. Maximum values are shown by the line 1202 and minimum values are shown by line 1204. In this case, the mean values 1206 deviate by a very large amount from one sample set to the next. The summed mean difference will return a very high value when this type of noise is experienced.

The summed mean difference thus acts as a reliable way to determine if our system is being influenced by destructive noise only, which reduces the overhead for the noise routines since they are only run when they are absolutely needed.

Noise Correction

Once it has been detected that the system is experiencing noise, additional routines are performed to attempt to correct that noise. In particular, the waveform is manipulated to reduce the effect of the noise. In some embodiments, oversampling may be increased to reduce the noise, but this results in a slower sensor response time to changes (i.e., it takes longer to detect a press if it takes longer to scan the sensor). In embodiments in which oversampling is employed, the oversampling can be decreased again after the noise has been reduced using the timing manipulation technique.

In some embodiments, the waveform is manipulated by dynamically changing one or more of the three timings discussed above. In some embodiments, all three timings may be adjusted one after another continuously to constantly attempt to find the minimal noise configuration. For example, the sampling rater may be adjusted first, then the time between the differential samples, and then the acquisition time. The process may then be repeated with different timing changes at each stage.

Figure 13:
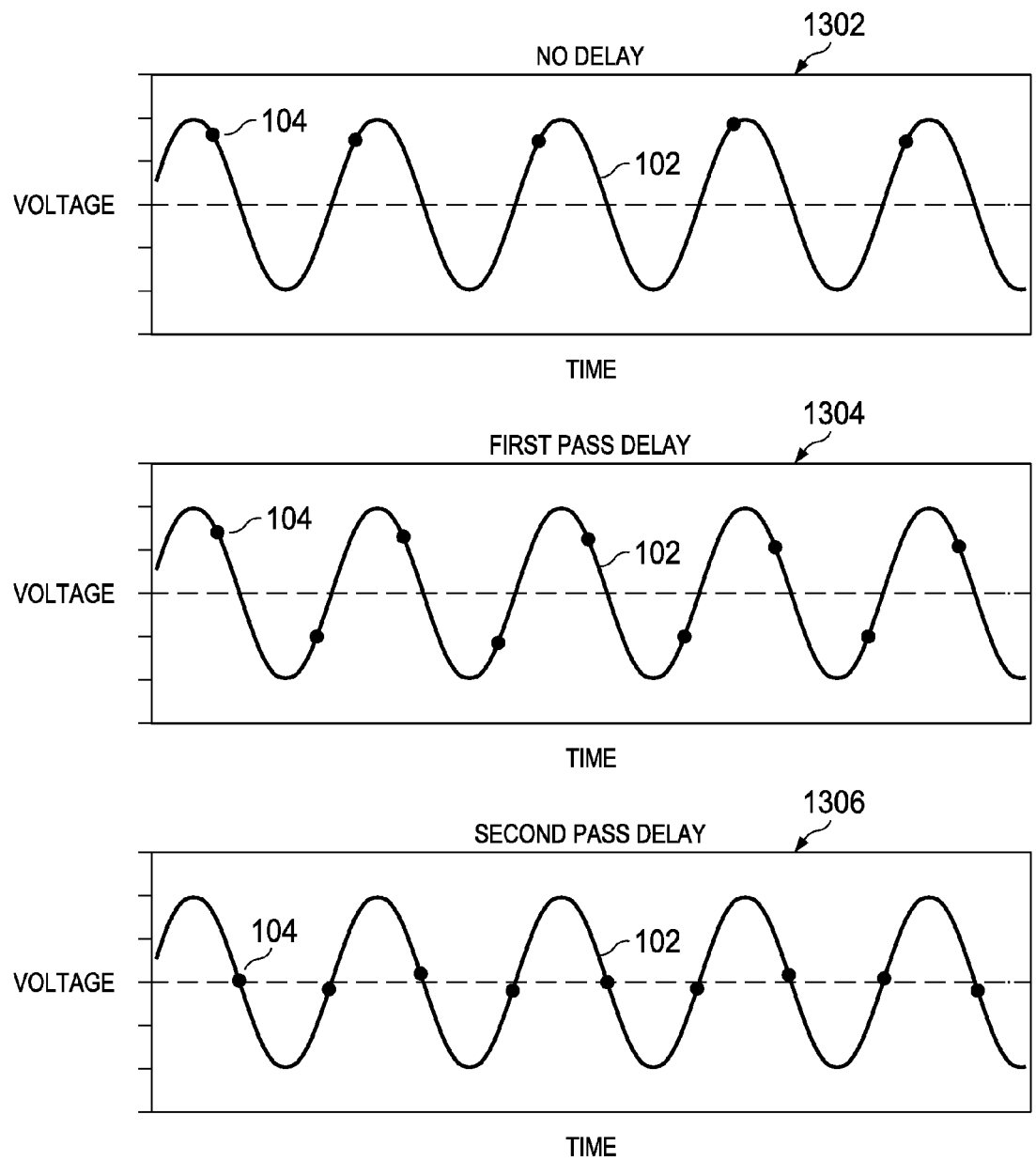
FIG. 13 schematically illustrates an effect of adding a sampling delay.
Figure 14:
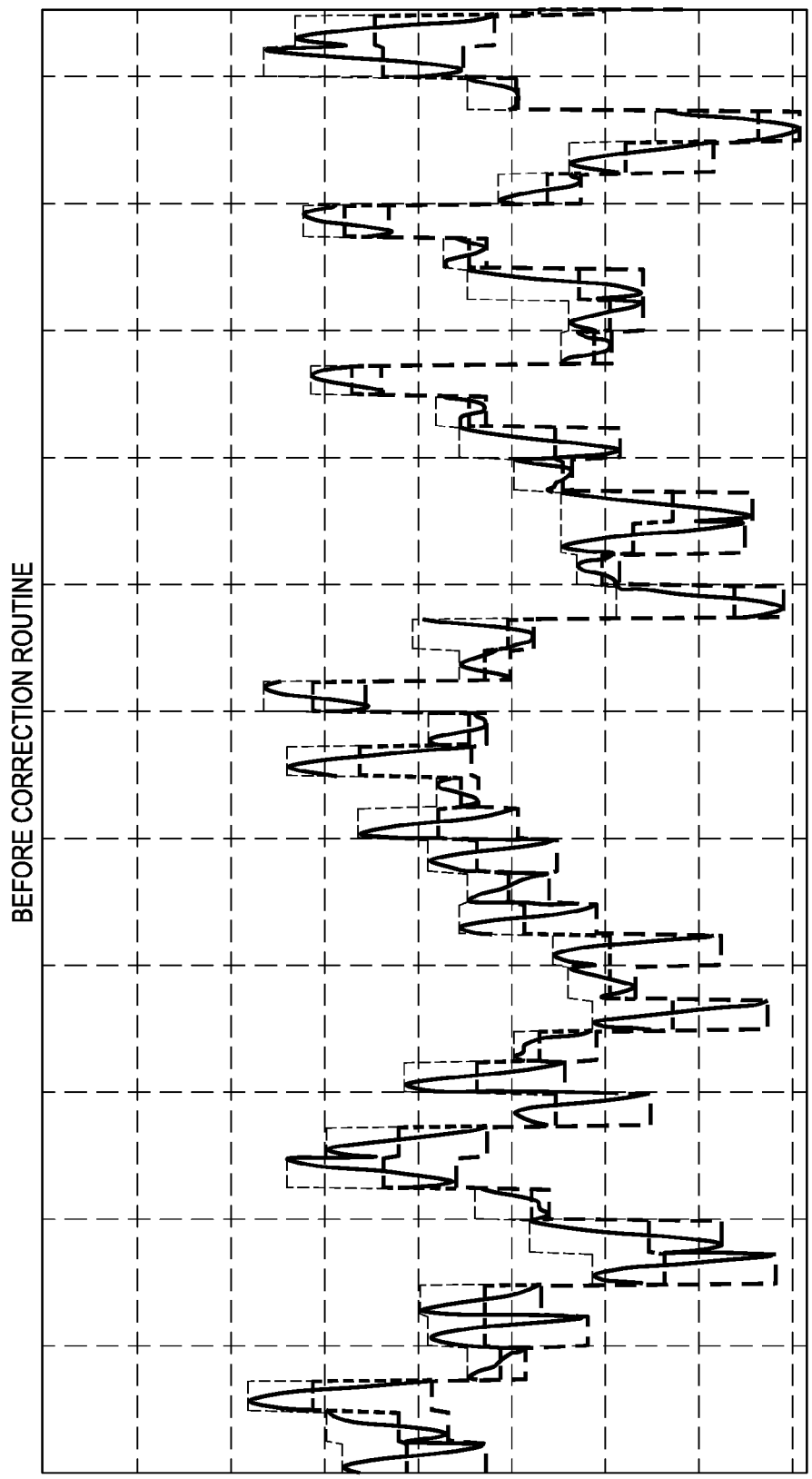
FIG. 14 shows destructive noise being applied to the sensor system of FIG. 1 with no correction applied.
Figure 15:
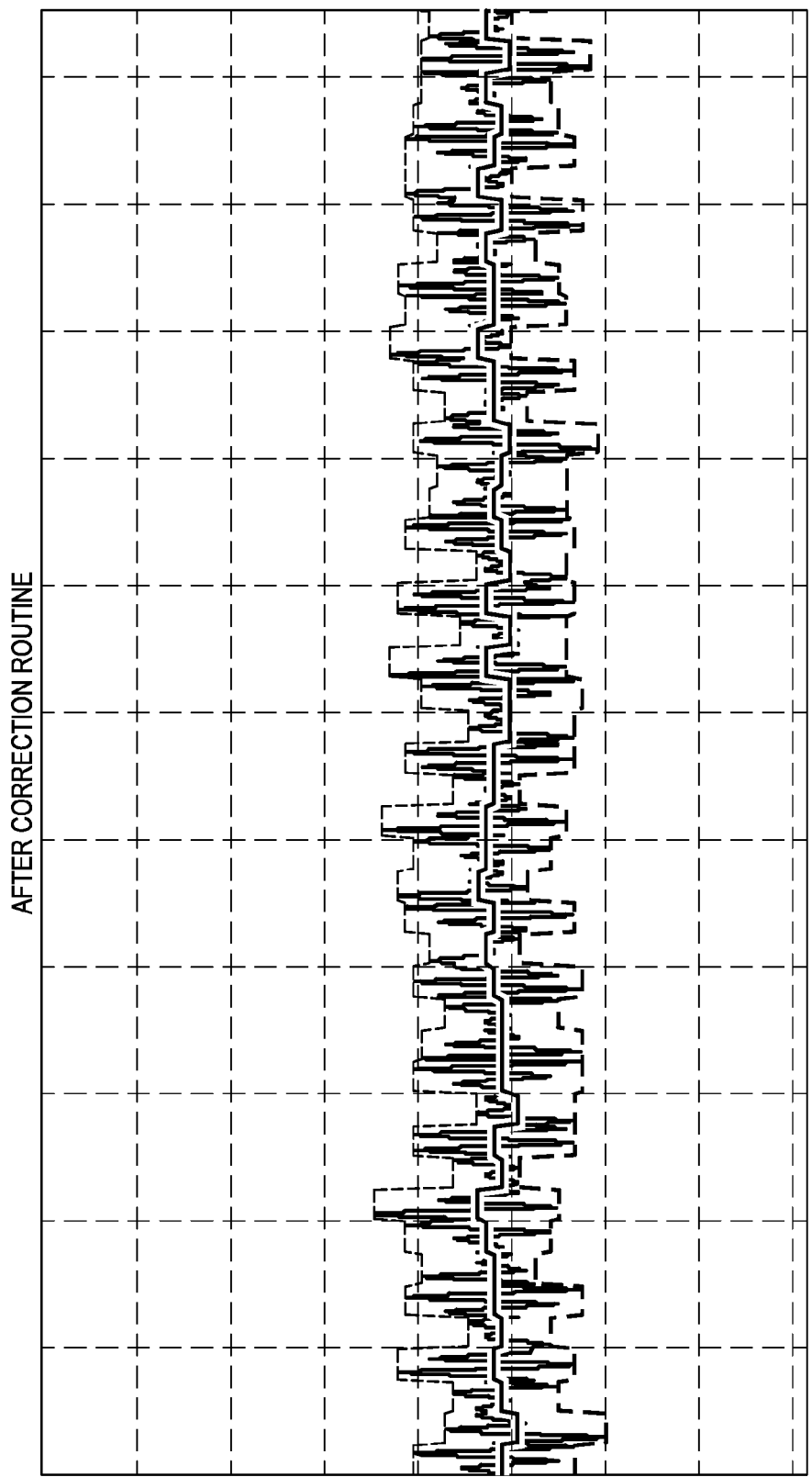
FIG. 15 shows destructive noise being applied to the sensor system of FIG. 1 with correction applied.

To see why, it is helpful to once again look at the difference between nondestructive and destructive noise. As shown, for example, at graph 1302 of FIG. 13, destructive noise 102 causes significant variations in the sampled values 104. (As in FIG. 1 and FIG. 2, the graph 1302 represents a mean of a packet of samples.) But a delay is added before each sample, it can become something like the picture of nondestructive noise. That is basically the role of the instant noise correction routines. They don't eliminate noise; they simply attempt to transform destructive noise into nondestructive noise. This can be seen in the progression shown by FIG. 13. Note that this is just a graphical representation of the theory and not actual data. At 1302, the noise is destructive. At 1304, a first pass delay d1 is added between samples. At 1306, a second pass delay d2 is added between samples. At this, point, the sampling is relatively constant. In some embodiments, a delay resolution may correspond to an instruction cycle of an implementing microcontroller (e.g., 125 ns with a 32 MHz clock, or 250 ns with a 16 MHz clock). In general, the finer the resolution, the higher the effective frequency. An actual experimental result is shown in FIG. 14 and FIG. 15. FIG. 14 shows destructive noise being applied to the system with no correction applied. FIG. 15 shows the result of noise correction routines in accordance with embodiments. It is the same test and same noise profile as in the other figures but now with the correction routines. The noise correction routines 808 will keep stacking delays between capacitive measurements and re-running the noise detection routines to see if the new delay correctly adjusted for the noise. If the Noise Detection routines 806 still detect noise, the Noise Correction routines 808 will run again and add a new delay on top of the old one. This process repeats until the Noise Detection routines 806 no longer detect noise or the number of times allowed to add a delay is overrun. An upper bound may be placed on the number of times to attempt to correct noise so this process doesn't loop infinitely. The actual delays being added may also be controlled so they don't grow exponentially large and bog down our system performance.

Once the correction routines 808 have run and the noise detection routines 806 no longer detect noise, the firmware is then allowed to move forward with the Decode and Tracking phase 704. In some embodiments, this isn't the end of the Noise Correction routine 808's job however. These routines 808 keep track of the state of the system, that is, whether it is in a noisy or clean state and performs certain actions based on whether entering, leaving, or staying in either of these states. The noise routines 808 make use of a noise timer that starts when the Noise Detection routines 806 return that noise is not detected when the system is in a noisy state.

While the timer is running, the system is still checking for noise and if noise is reintroduced into the system, the timer is cancelled. The system won't change to a clean state until the timer overflows. This takes care of the case where the Noise Detection routines 808 don't detect noise that is actually present. That is, the timer is used to ensure that a transition to a "clean" state does not occur until several sequential clean scans have been performed. This provides greater assurance that the signal is truly without noise instead of a single, false reading that looks clean.

Figure 16:
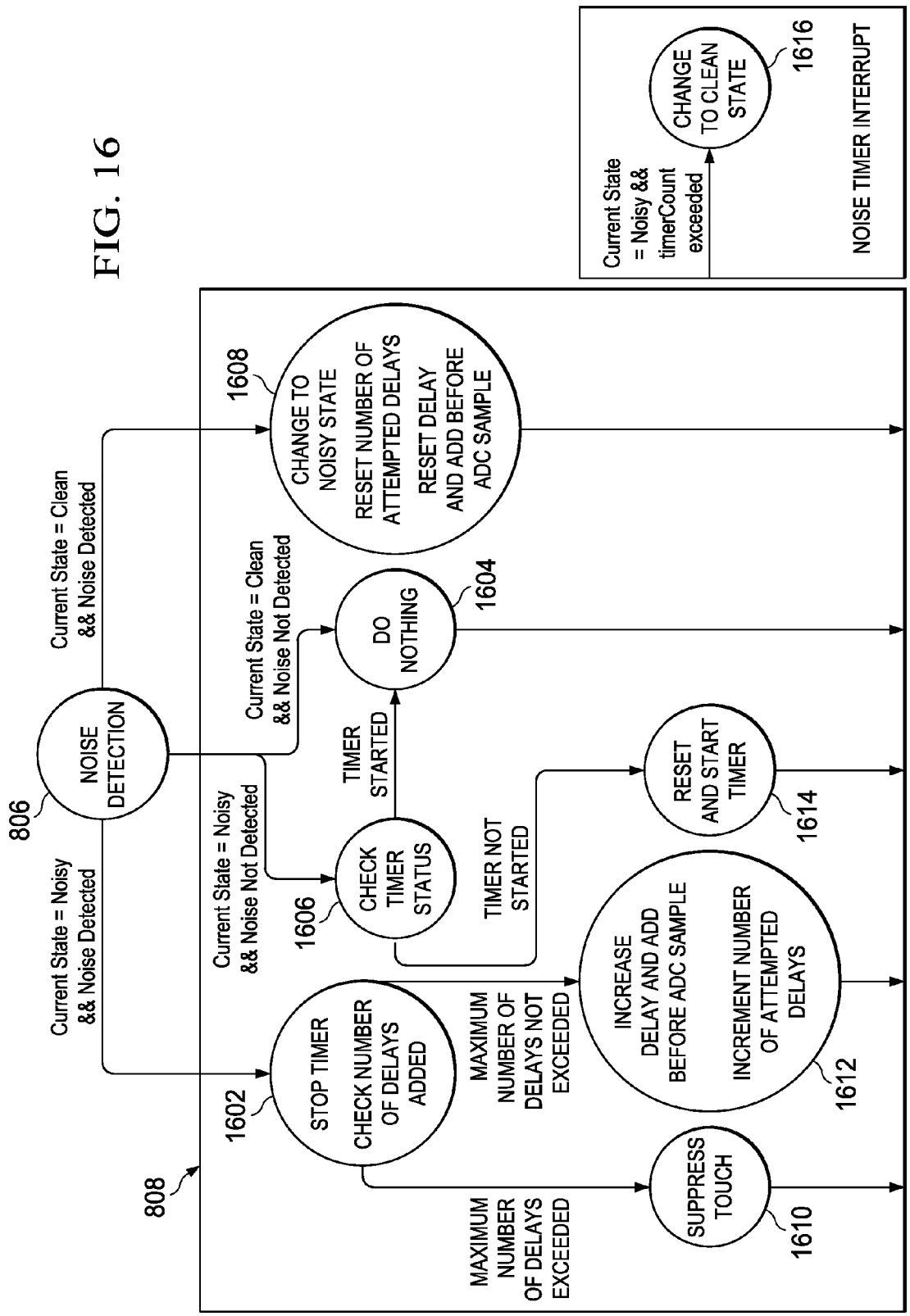
FIG. 16 illustrates an exemplary state diagram illustrating noise correction in accordance with embodiments.

The state machine as shown in FIG. 16 outlines how the Noise Correction routines 808 handle this. More particularly, if the current state is noisy and noise is detected, then the routine enters state 1602, to stop the timer and check the number of delays added. If the maximum has been exceeded, then the touch is suppressed at state 1610. Otherwise, at state 1612, the delay is increased and added before the sample, and the number of attempted delays is incremented.

If the current state was noisy and noise was not detected, then the timer status is checked in state 1606. If it has not been started, it is reset and started, in state 1614. If the timer has been started, then the system enters a do nothing state 1604. If the current state was clean and noise was not detected, then the system enters the do nothing state 1604.

If the current state was clean and noise is detected, then the system enters state 1608. The system updates to a noisy state and rests the number of attempted delays. In addition, the delays are reset and added to the before the sample.

Finally, if the current state is noisy and the timer count is exceeded, the system will change to a clean status in state 1616.

It is important to note that while the noise routines are looping through and trying to find a delay that fixes the noise, no touch data is being sent out. This is important because noisy, non-corrected data should not be transmitted, as it will likely be data made useless by the noise influencing the system.

Digital Filtering

According to some embodiments, the digital filtering routine (which may be implemented as part of the self digital filter 804, the mutual digital filter 812, or in the decode and tracking module 704) is a simple moving average filter that is performed on raw data acquired from the self and mutual scans. However not all scans are filtered according to various embodiments. There are three types of scans performed and only one of these is actually filtered. The three types are:

1.) Normal scans—these occur when the sensor is being scanned for a touch and are suspended when noise is detected.

2.) Baseline scans—these occur when we are updating the baseline of the system.

3.) Noise scans—these are the scans run by the noise routines and are performed when noise is detected, as discussed above. Once the system is identified to be in a noisy state, the noise scans are used to try and re-try different delays to adjust for the noise. Normal scans are resumed after the system re-enters a clean state. In some embodiments, only the Normal Scans are filtered, since there is no point in removing the noise from the signal prior to detecting it. Also the baseline scans are only run during a no-touch state and as stated above, in some embodiments, not enough noise is coupled into the system during a no-touch state to be detected.

The moving average filter is as follows:

$$Y_n = \frac{(\alpha - 1)Y_{n-1} + X_n}{\alpha}$$

where $\alpha$ = filter coefficient

The filter coefficient acts as a weight ratio of how much influence the previous measurements have on the current measurement. A large value for a will result in a heavy influence from previous values while a small value will result in less influence. Unlike the noise routines which only run when noise is detected, the filter is running constantly if it is enabled. The filter is run for each individual capacitive sample taken. So if 16 samples are taken, 16 iterations of the filter are run. The seed for the very first sample taken is the average signal level of all the samples in that set. Each sequential capacitive sample then uses the previous filtered sample as its seed. By using the average signal of all samples in the set, the filtering cannot be performed in-line with taking the capacitive measurements; it is done after all the samples have been taken.

Figure 17:
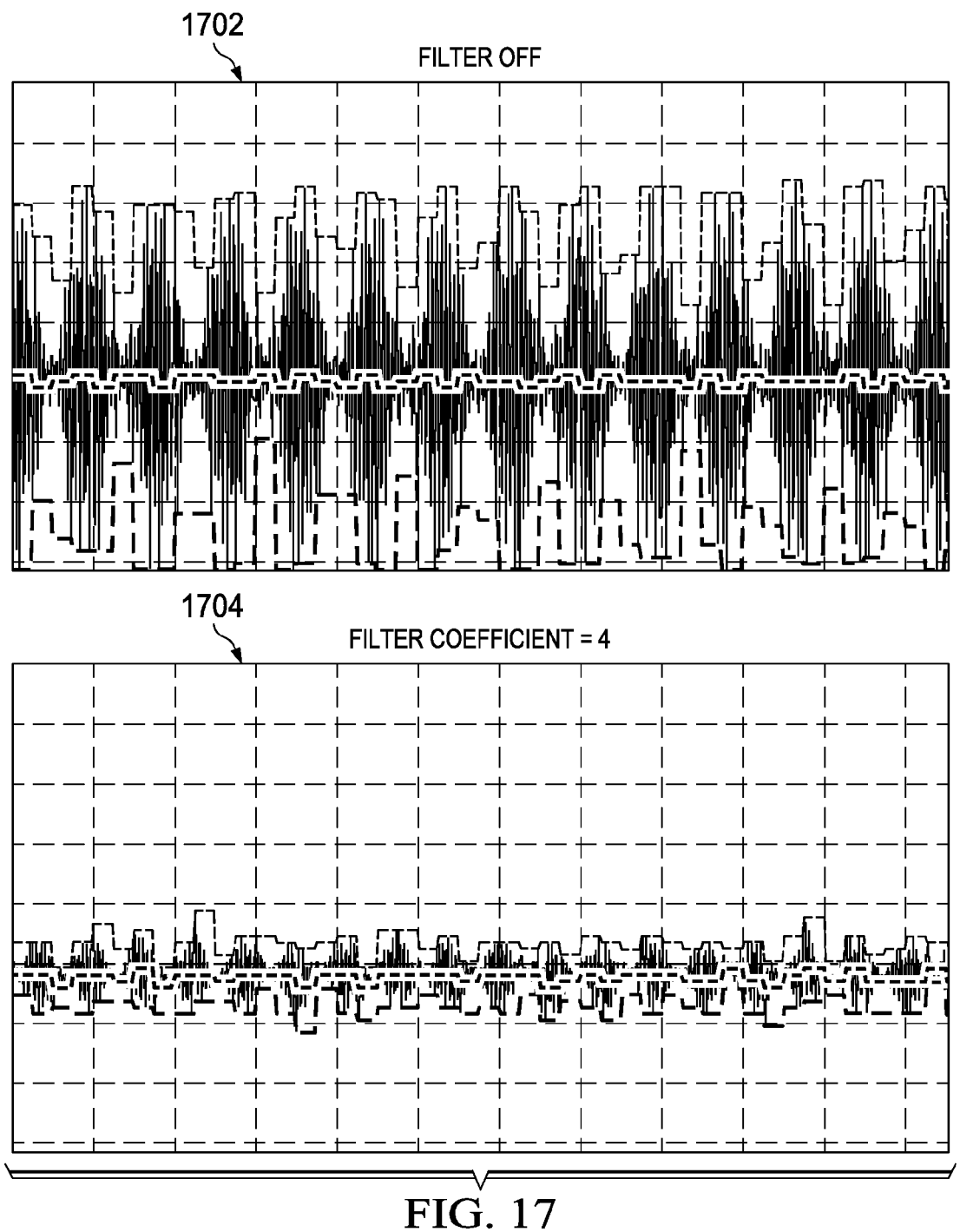
FIG. 17 illustrates noise filtering in accordance with embodiments.

FIG. 17 shows screenshots of the filtering results when the system is experiencing noise. At 1702, the filter is off, although the noise correction routines have been run. At 1704, the filter is on, showing significant reductions in noise levels.

Figure 18:
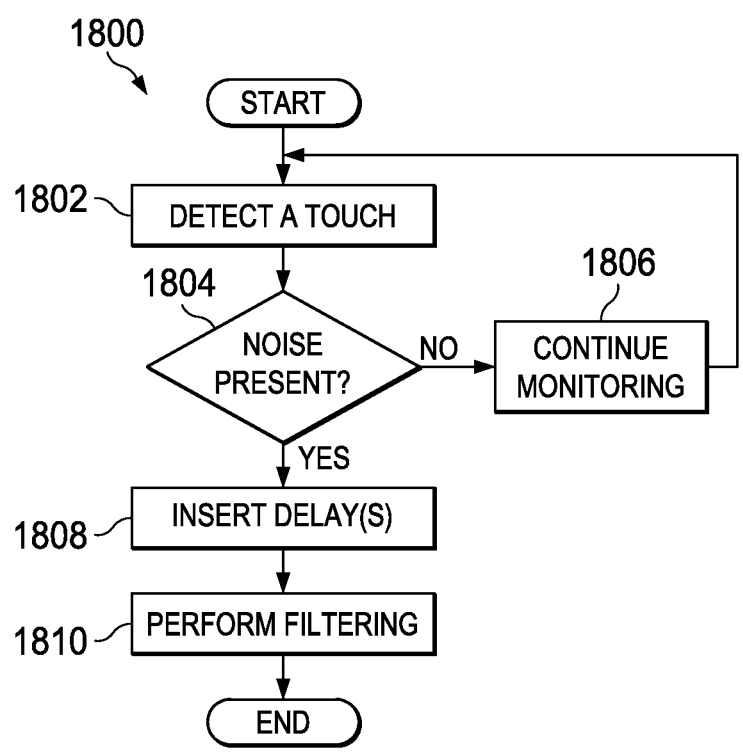
FIG. 18 is a flowchart illustrating operation of embodiments.

FIG. 18 is a flowchart illustrating operation of an embodiment. Initially, a touch may be detected (1802). Once a touch is detected, a determination of the presence of noise is made (step 1804). As noted above, this may be performed using a summed mean difference technique over a plurality of samples and determining if the result exceeds a predetermined threshold. If noise is not present, then the system will continue monitoring for noise, in a step 1806.

If noise is present, then the signal may be manipulated to correct for the noise. In particular, in some embodiments, one or more timing settings may be adjusted, such as by adding a delay. As discussed above, the timings may be the sampling times, the time between waveforms, or the acquisition timing. The delay may be a predetermined increment or from a selection of one or more predetermined or random delay options. (step 1808)]. As discussed above, this process may iterate until the delay or a timer exceed predetermined threshold/counts. Once noise is determined to no longer exceed the threshold, the system implements filtering on the signal (step 1810) and the signal is provided for decode and tracking.

Figure 19:
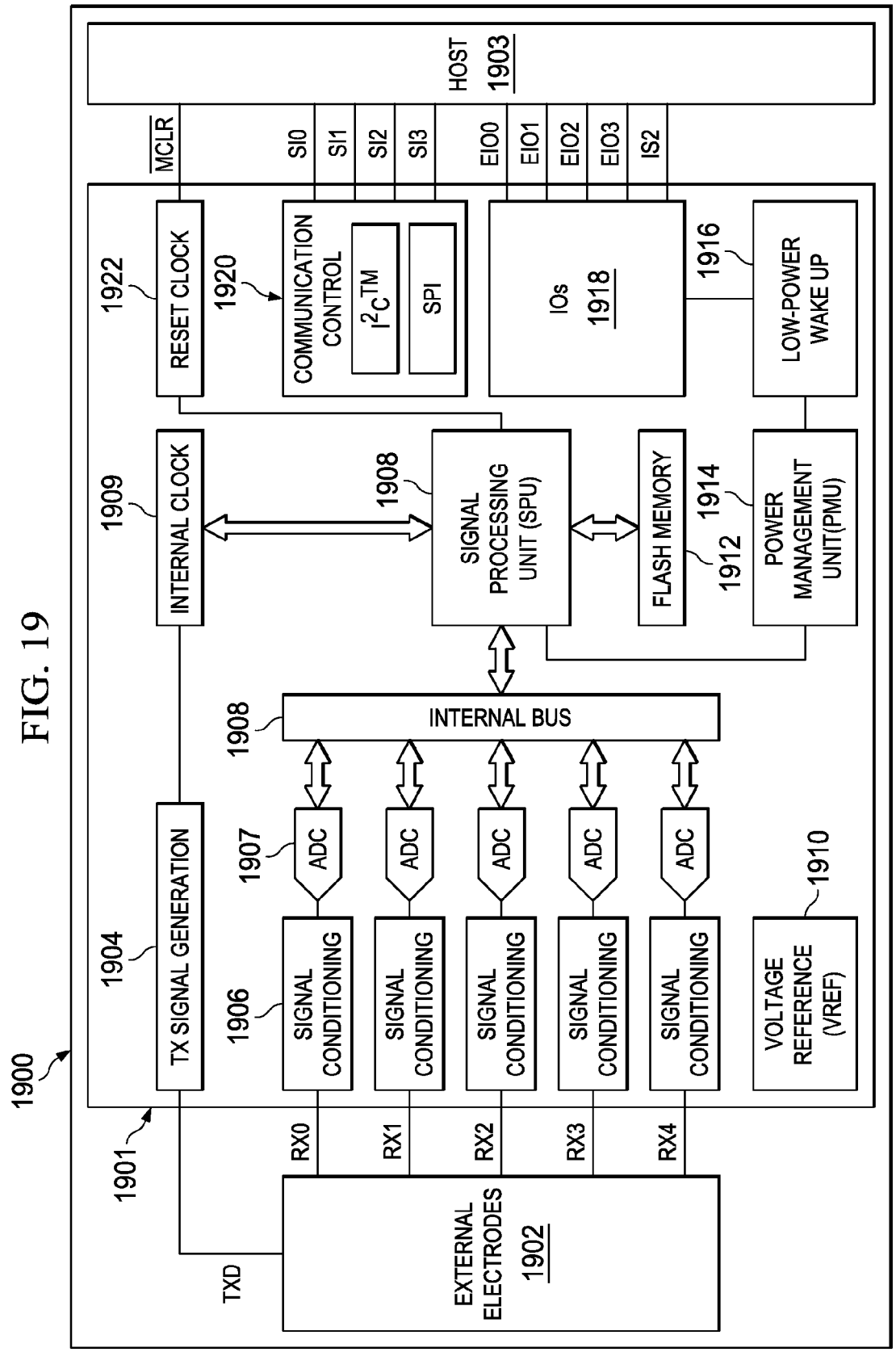
FIG. 19 is a block diagram illustrating a touch sensor system according to embodiments.

Finally, FIG. 19 is a block diagram illustrating a sensor system 1900 that may be used to implement noise robustness according to embodiments. The system 1900 includes a sensing controller 1901, sensing electrodes 1902, and a host system 1903. The sensing electrodes 1902 may implement a configuration such as shown in FIG. 1. The host 1903 may be any system that can make use of capacitive sensor signals and/or information or data derived therefrom, such as cell phones, laptop computers, I/O devices, and the like.

In the example illustrated, a TX signal generator 1904 provides a transmitter signal $V_{TX}$ to the transmit electrode TXD. Receive electrodes RX0-RX4 are read by signal conditioning modules 1906. The outputs of signal conditioning are provided to ADCs 1907 and, via signal lines or other medium such as a bus 1908, to a signal processing unit 1908. The signal processing unit 1908 may implement the functionality of the acquisition, decode and tracking, and communication (FIG. 7). Resulting outputs may be provided via IO unit 1919 to the host 1903.

The system may further include a variety of additional modules, such as internal clock 1909, memory such as flash memory 1912, a voltage reference 1910, power management 1914, low-power wake-up 1916, reset control 1922, and communication control 1920.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Any suitable programming language can be used to implement the routines, methods or programs of embodiments of the invention described herein, including C, C++, Java, assembly language, etc. Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps and operations described herein can be performed in hardware, software, firmware or any combination thereof.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code any of the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more general purpose digital computers, by using application specific integrated circuits, programmable logic devices, field programmable gate arrays, and so on. Optical, chemical, biological, quantum or nanoengineered systems, components and mechanisms may be used. In general, the functions of the invention can be achieved by any means as is known in the art. For example, distributed, or networked systems, components and circuits can be used. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. Such computer-readable medium shall generally be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any, hardware system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A method for reducing noise in a sensor measurement system, comprising:
   performing capacitive to digital conversion measurements from a sampling waveform, detecting that the sensor measurement system is experiencing noise,
   in response to a detection that the sensor measurement system is experiencing noise, dynamically modifying the sampling waveform by changing one or more delays before performing the sampling waveform again.

2. A method in accordance with claim 1, wherein the one or more delays comprise one or more delays in a time between samples of the sampling waveform.

3. A method in accordance with claim 1, wherein the one or more delays comprise one or more delays in a time between an end of a one sampling waveform and the start of a next sampling waveform.

4. A method in accordance with claim 1, wherein the one or more delays comprise one or more delays in an acquisition time of a sample.

5. A method in accordance with claim 1, wherein detecting that the sensor measuring system is experiencing noise comprises performing noise scans and determining a summed mean difference between sets of measurements.

6. A method in accordance with claim 1, wherein detecting that the sensor measuring system is experiencing noise comprises performing noise scans and determining if a measurement is asymmetrical.

7. A method in accordance with claim 1, further comprising filtering the sampling waveform.

8. A system, comprising:
   a processor; and
   one or more tangible computer-readable media including instructions which, when executed the processor, implement a method for reducing noise in a sensor measurement system, the method comprising:
      performing capacitive to digital conversion measurements;
      from a sampling waveform, detecting that the sensor measurement system is experiencing noise; and
      in response to a detection that the sensor measurement system is experiencing noise, dynamically modifying the sampling waveform by changing one or more delays before performing the sampling waveform again.

9. A system in accordance with claim 8, wherein the one or more delays comprise one or more delays in a time between an end of a one sampling waveform and the start of a next sampling waveform.

10. A system in accordance with claim 8, wherein the one or more delays comprise one or more delays in an acquisition time of a sample.

11. A system in accordance with claim 8, wherein the noise detector is configured to determine a summed mean difference between sets of measurements of a noise scan.

12. A system in accordance with claim 8, wherein the noise detector is configured to determine if a measurement of a noise scan is asymmetrical.

13. A system in accordance with claim 8, further comprising a digital filter for filtering the sampling waveform.

14. A computer program product including one or more non-transitory tangible computer-readable media including instructions which, when executed on a computer, implement a method for reducing noise in a sensor measurement system, the method comprising:
   performing capacitive to digital conversion measurements,
   from a sampling waveform, detecting that the sensor measurement system is experiencing noise, and
   in response to a detection that the sensor measurement system is experiencing noise, dynamically modifying the sampling waveform by changing one or more delays before performing the sampling waveform again.

15. A computer program product in accordance with claim 14, wherein the one or more delays comprise one or more delays in a time between samples of the sampling waveform.

16. A computer program product in accordance with claim 14, wherein the one or more delays comprise one or more delays in a time between an end of a one sampling waveform and the start of a next sampling waveform.

17. A computer program product in accordance with claim 14, wherein the one or more delays comprise one or more delays in an acquisition time of a sample.

18. A computer program product in accordance with claim 14, wherein detecting that the sensor measuring system is experiencing noise comprises performing noise scans and determining a summed mean difference between sets of measurements.

19. A computer program product in accordance with claim 14, wherein detecting that the sensor measuring system is experiencing noise comprises performing noise scans and determining if a measurement is asymmetrical.

20. A computer program product in accordance with claim 14, further comprising filtering the sampling waveform.

* * * * *